(12) United States Patent
Knickerbocker

(10) Patent No.: US 7,541,203 B1
(45) Date of Patent: Jun. 2, 2009

(54) CONDUCTIVE ADHESIVE FOR THINNED SILICON WAFERS WITH THROUGH SILICON VIAS

(75) Inventor: John U Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/119,863

(22) Filed: May 13, 2008

(51) Int. Cl.
*H01L 21/00* (2006.01)
(52) U.S. Cl. .................................. 438/17; 257/E21.521
(58) Field of Classification Search .................. 438/14, 438/17; 257/E21.521
See application file for complete search history.

(56) References Cited

U.S. PATENT DOCUMENTS

| | | | |
|---|---|---|---|
| 6,268,739 B1 | 7/2001 | Bernier et al. | |
| 6,288,559 B1 | 9/2001 | Bernier et al. | |
| 6,559,666 B2 | 5/2003 | Bernier et al. | |
| 7,129,567 B2 * | 10/2006 | Kirby et al. | 257/621 |
| 7,135,345 B2 | 11/2006 | Hamren et al. | |
| 7,341,881 B2 * | 3/2008 | Watkins et al. | 438/26 |
| 2001/0024127 A1 | 9/2001 | Bernier et al. | |
| 2005/0014301 A1 | 1/2005 | Hamren et al. | |
| 2005/0042782 A1 | 2/2005 | Hamren et al. | |
| 2005/0070072 A1 * | 3/2005 | Priewasser | 438/460 |
| 2007/0155029 A1 | 7/2007 | Hamren et al. | |

FOREIGN PATENT DOCUMENTS

WO   WO 00/31784   6/2000

\* cited by examiner

*Primary Examiner*—W. David Coleman
(74) *Attorney, Agent, or Firm*—Leander F. Aulisio

(57) ABSTRACT

The present invention relates to a process for preparing a thinned silicon wafer for electrical testing, the thinned silicon wafer comprising at least one circuit design and at least one through-silicon via or hole; the process comprising temporarily attaching the thinned silicon wafer to a mechanical handler by means of an electrically conductive polymeric adhesive material.

1 Claim, 1 Drawing Sheet

CONDUCTIVE ADHESIVE FOR THINNED SILICON WAFERS WITH THROUGH SILICON VIAS

The present invention relates to a process for performing electrical testing and reliability screening on semiconductor wafers; and particularly to a process for testing thinned silicon wafers that contain through-silicon vias (TSVs) or holes.

BACKGROUND OF THE INVENTION

Semiconductor manufacturers who make integrated circuit chips begin by manufacturing semiconductor wafers. Each wafer is typically 100 mm, 125 mm, 150 mm, 200 mm or 300 mm in diameter and contains anywhere from one to several thousand chips or die on the wafer. When manufacture of the wafer is completed, chips or die are cut or "diced" from the wafer and may later be mounted into single chip or multiple chip packages for implementation in a printed circuit board or other applications.

When manufacture of a wafer is completed, and before the chips or die are cut or "diced" from the wafer, it is customary practice to test each chip on the wafer to determine whether each chip, as manufactured, electrically matches design criteria, matches performance criteria of the system in which the chip is to be implemented, and will be reliable in operation. If a chip fails electrical testing or reliability testing, the chip is not suitable for implementation in a system without repairing the chip or exercising redundancy features which may have been designed into the chip. Performance testing of chips may be used to speed sort chips into different categories suitable for different applications.

Reliability testing is used to screen out chips having an undesirable short life span. Typically, a significant percentage of a group of chips will fail early in their lifetime due to marginal conditions during manufacture. Subsequently, a very low percentage of the group will fail during an extended period of use of the chips. Reliability testing of semiconductor chips is typically performed by a process of supplying test signal patterns to chips under test to repeatedly stimulate all devices and wires on a chip. It is typically performed at elevated temperatures to simulate the first six months of operation. The testing procedure is known as burn-in.

Burn-in is typically performed on integrated circuits at temperatures between 90 degrees C. to 125 degrees C., for a time of up to about 150 hours.

US Patent Application Publication No. 2005/0014301, submitted by Hamren et al, published Jan. 20, 2005, relates to an improved method and apparatus for the handling and testing of semiconductor devices. Semiconductor dice are temporarily attached to a die carrier to enable testing of the dice with conventional technology. In one embodiment, the die carrier comprises a flex circuit base substrate and a rigid support frame. A temporary electrical connection is made with the semiconductor dice during testing. Materials for making the electrical connection are selected from the group consisting of a conductive film, a conductive tape, a conductive epoxy resin, and other adhesives containing a conductive filler.

WO 00/31784, published on Jun. 2, 2000, relates to the use of a sacrificial support to allow selective etching of a wafer having a semiconductor active device layer on one surface of the wafer. The sacrificial support is bonded to one surface of the wafer, and provides structural integrity to the transistor device layer. The sacrificial support is removed after formation of a heat conductive layer. By use of the sacrificial support as a mechanical handling means, a thin active device layer can be formed and processed.

None of the above references, taken either separately or in combination, serve to anticipate the present invention as herein disclosed and claimed.

SUMMARY OF THE INVENTION

The present invention relates to a process for preparing a thinned silicon wafer containing through-silicon vias (TSVs) or holes for electrical testing. Thinned silicon wafers typically use mechanical handlers for processing. The wafers are temporarily attached to the mechanical handler using an adhesive material such as a polyimide or the like. A thinned silicon wafer refers to a wafer that has been modified as by a grinding operation or the like. The thinned silicon wafer is useful in the process of preparing a die. Preferably, a plurality of die are constructed on a single thinned silicon wafer.

Use of an electrically conductive adhesive for attachment of the mechanical handler to the thinned silicon wafer allows for electrical testing to verify that the TSVs are conductive. Testing can also be conducted for shorts, leakage and circuit function. The processing, handling and testing of the thinned silicon wafer can be conducted while the wafer is grounded. This protects the wafer by avoiding electrostatic discharge. Electrostatic discharge can cause damage to the circuits present on the wafer and the conductive features present on the wafer, or on a die on the wafer.

DETAILED DESCRIPTION OF THE INVENTION

Figure 1:
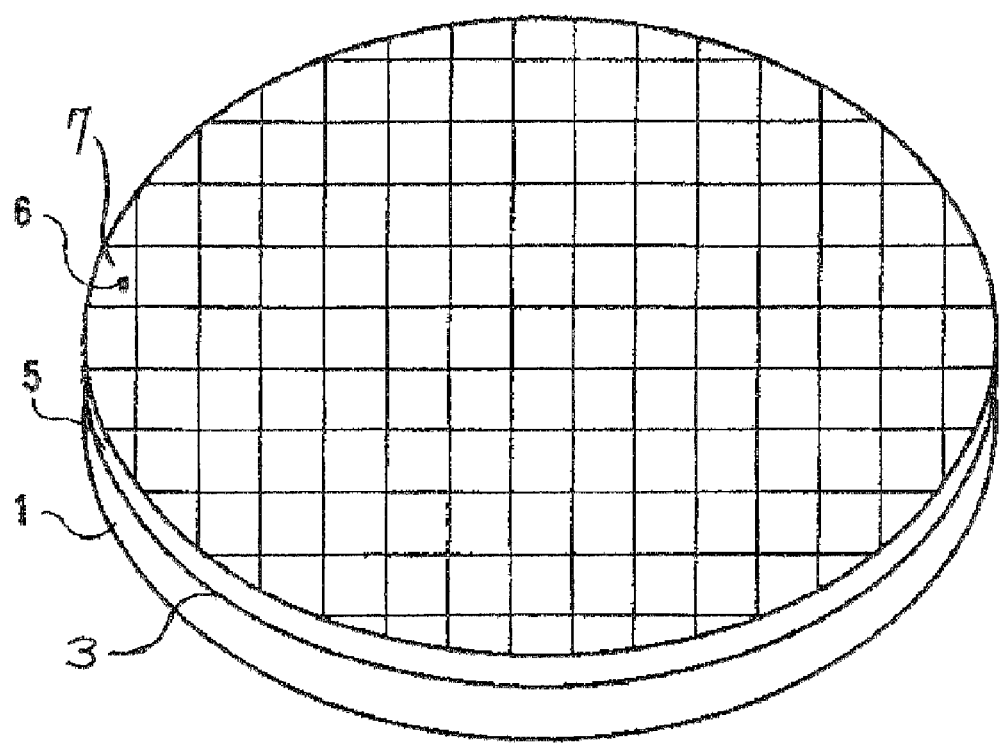
FIG. 1 relates to a schematic representation of a thinned silicon substrate having at least one through-silicon via (TSV). The thinned silicon substrate is attached directly to a mechanical handler. A layer of conductive adhesive is employed to attach the thinned silicon substrate to the mechanical handler.

An embodiment of the present invention is a process for the use of an electrically conductive adhesive composition for performing electrical testing or burn-in test evaluations on thinned silicon wafers containing TSV and circuit designs. The testing of the thinned silicon wafer, the thinned silicon die, the thinned silicon stacked die or the thinned silicon stacked wafer can be performed without damage to the die or wafer. Since the adhesive material is conductive, testing can be performed on either side of the wafers. Testing can be performed on the through-silicon vias (TSVs). The electrically conductive adhesive can also be thermally conductive. It is therefore effective in enhanced heat dissipation during wafer testing.

Electrically conductive adhesive compositions include polymeric materials that contain conductive fillers. Epoxy polymeric adhesives containing an electrically conductive filler are examples of conductive adhesives. Other examples of conductive adhesives are polyimides that contain metal fillers. The choice of the metal filler depends on the particular test being performed, compatibility with other processing material and the like. Conductive materials can include silver, palladium, gold, copper, nickel, tin or other metals or metal alloys. In the alternative, a conductive polymer such as conductive carbon fiber can be employed. In another embodiment, both electrical and thermal conductivity can be achieved by employing various fillers known to one of ordinary skill in the art.

In one embodiment of the present invention, the electrically conductive adhesive composition can contain fibrous fillers that become conductive when the composition is compressed or cured.

The electrically conductive adhesives provide a temporary conductive path for performing electrical testing. After the testing is completed, the adhesive is removed as by laser release, chemical release, ashing or the like. Thus, the adhesive composition does not interfere with the functioning of the die or wafer.

Another embodiment of the present invention relates to a process for the use of an electrically conductive adhesive composition for temporarily bonding a single die to a mechanical handler. The mechanical handler can be a glass substrate, a silicon wafer or the like.

Another embodiment of the present invention is a process for the use of a thermally conductive adhesive composition for the temporary bonding of a thinned silicon wafer having through-silicon vias or holes to a support substrate such as a glass substrate or a silicon wafer. The thermally conductive adhesive allows for the electrical testing of the thinned silicon wafer under conditions of enhanced heat dissipation. The thermally conductive adhesive composition can have fibrous fillers that allow for heat dissipation. Testing of thinned silicon wafers containing TSVs is more difficult than the testing of silicon wafers that do not have through-silicon vias (TSVs). This is because the thinned silicon wafers having TSVs are much more fragile. They have a thickness of only about 200 micrometers or less, as compared to a typical wafer or die that has a thickness of about 700 micrometers or more. Also, the thinned silicon wafers containing TSVs have a lowered mechanical strength due to the presence of the TSVs. Further, the testing of the present invention can be performed on very fine pitch interconnections and TSV pitch. The TSV (through-silicon via) pitch can be as small as about 0.2 millimeters or less. Alternatively, the TSV pitch can be about 0.01 millimeters or less.

Another embodiment of the present invention is a process for electrically testing a thinned silicon wafer containing through-silicon vias or holes. The process comprises obtaining a thinned silicon wafer comprising at least one through-silicon via (TSV), and, optionally, at least one circuit design. The process further comprises obtaining a substrate selected from the group consisting of a glass substrate and a silicon wafer. The substrate comprises no conductive pads. The process further comprises obtaining a polymeric adhesive composition comprising at least one electrically conductive material. The process further comprises bonding the thinned silicon wafer to the substrate by means of the polymeric adhesive composition. And then the process comprises electrically testing the thinned silicon wafer.

FIG. 1 relates to a thinned silicon substrate 5 that is attached to a mechanical handler 1 by means of a conductive adhesive 3. The conductive adhesive 3 can be in the form of a thin layer that uniformly covers the thinned silicon substrate 5. Alternatively, the conductive adhesive 3 can be in the form of discrete non-uniform contact points between the thinned silicon substrate 5 and the mechanical handler 1. The thinned silicon substrate 5 contains an uncut die 7 that comprises a through-silicon via 6. The thinned silicon substrate 5 can be a member selected from the group consisting of a thinned silicon wafer, a stack of thinned silicon wafers. Alternatively, the thinned silicon wafer can be a single die or a stack of thinned die (not shown).

The present invention relates to a process for electrically testing a thinned silicon substrate containing a through-silicon via and a circuit design or die. The process comprises obtaining a thinned silicon substrate comprising at least one through-silicon via (TSV) and at least one circuit design. The thinned silicon substrate is a member selected from the group consisting of a thinned silicon wafer, a stack of thinned silicon wafers, a thinned die and a stack of thinned die. The process further comprises obtaining a polymeric electrically conductive adhesive composition. A mechanical handler is then provided. The mechanical handler is a member selected from the group consisting of a glass substrate and a thick silicon wafer. The mechanical handler further comprises a grounding path. The grounding path passes to the thinned silicon substrate and through the electrically conductive adhesive. The process further comprises forming a temporary bond between the thinned silicon substrate and the mechanical handler by means of the adhesive composition. The process further comprises electrically testing the thinned silicon substrate; whereby the at least one circuit design is substantially protected from electrostatic discharge by means of the grounding path.

While the invention has been describe by specific embodiments, there is no intent to limit the inventive concept except as set forth in the following claims.

I claim:

1. A process for electrically testing a thinned silicon substrate containing a through-silicon via, the process comprising:

obtaining a thinned silicon substrate having a thickness of less than about fifty micrometers comprising at least one through-silicon via (TSV) and at least one circuit design; wherein the thinned silicon substrate is a member selected from the group consisting of a thinned silicon wafer, a stack of thinned silicon wafers, a thinned die and a stack of thinned die;

obtaining a polymeric electrically conductive adhesive composition;

obtaining a mechanical handler which is a member selected from the group consisting of a glass substrate and a thick silicon wafer, wherein the mechanical handler comprises a grounding path to the thinned silicon substrate and through the electrically conductive adhesive;

forming a temporary bond between the thinned silicon substrate and the mechanical handler by means of the adhesive composition; and electrically testing the thinned silicon substrate; whereby the at least one circuit design is substantially protected from electrostatic discharge by means of the grounding path.

* * * * *